(12) United States Patent
Smail

(10) Patent No.: US 9,031,171 B2
(45) Date of Patent: May 12, 2015

(54) DIGITAL DOWN CONVERTER CIRCUIT

(71) Applicant: NXP B.V., Eindhoven (NL)

(72) Inventor: Zahir Smail, Cairon (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/080,082

(22) Filed: Nov. 14, 2013

(65) Prior Publication Data

US 2014/0169504 A1    Jun. 19, 2014

(30) Foreign Application Priority Data

Dec. 17, 2012  (EP) ..................................... 12290444

(51) Int. Cl.
| | |
|---|---|
| *H04L 27/06* | (2006.01) |
| *H04B 1/10* | (2006.01) |
| *H04B 1/16* | (2006.01) |
| *H04B 1/00* | (2006.01) |

(52) U.S. Cl.
CPC .............. *H04B 1/16* (2013.01); *H04B 1/0007* (2013.01); *H03D 2200/005* (2013.01); *H03D 2200/0062* (2013.01)

(58) Field of Classification Search
CPC .... H04L 27/22; H04B 1/0007; H04B 1/7097; H04B 1/7101; H04B 1/7102; H03D 2200/005; H03D 2200/0054; H03D 2200/0056; H03D 2200/0058; H03D 2200/006; H03D 2200/0062
USPC .................. 375/316, 340, 346, 350
See application file for complete search history.

(56) References Cited

U.S. PATENT DOCUMENTS

| | | | |
|---|---|---|---|
| 5,757,867 A | 5/1998 | Caulfield et al. | |
| 5,926,455 A * | 7/1999 | Allpress | 370/210 |
| 6,049,573 A | 4/2000 | Song | |
| 7,027,942 B1 * | 4/2006 | Woodard et al. | 702/76 |
| 7,145,972 B2 | 12/2006 | Kumar et al. | |
| 7,158,591 B2 * | 1/2007 | Harris | 375/350 |
| 7,164,741 B2 * | 1/2007 | Harris | 375/350 |
| 8,176,107 B2 * | 5/2012 | Sturza et al. | 708/313 |
| 8,625,726 B2 * | 1/2014 | Kuan et al. | 375/350 |
| 2003/0232613 A1 | 12/2003 | Kerth | |

FOREIGN PATENT DOCUMENTS

| | | |
|---|---|---|
| CN | 101 621 279 A | 1/2010 |
| EP | 2 369 362 | 9/2011 |

OTHER PUBLICATIONS

Vaughan, R. G. et al "The theory of Bandpass Sampling", IEEE Trans. on Signal Processing, vol. 39, No. 9, pp. 1973-1984 (Sep. 1999).

Lyons, R. G. "Digital Signal Processing: Frequency Translation without Multiplication", EE Times-India, eetindia.com, 4 pgs. (Sep. 2007).

(Continued)

*Primary Examiner* — Khanh C Tran

(57) ABSTRACT

A digital down converter is disclosed. The digital down converter includes an input for receiving a sampled signal having a frequency band of interest, sampled at a first sampling rate, a commutator structure for distributing a set of real sampled signals for polyphase filtering, a complex band pass polyphase filter associated with the distributed signals, for generating in phase and quadrature filtered components, a baseband notch filter, and a frequency translator for generating in phase and quadrature components of the frequency band of interest at baseband.

12 Claims, 8 Drawing Sheets

(56) References Cited

OTHER PUBLICATIONS

Awan, M. et al. Polyphase Channelizer as Bandpass Filters in Multi-Standard Software Defined Radios, Second International Workshop on Cognitive Radio and Advanced Spectrum Management, pp. 59-63 (May 2009).

Turner, C. S. "An Efficient Analytic Signal Generator", IEEE Signal Processing Magazine, vol. 25. No. 4, pp. 91-94 (Jul. 2009).

Maoweil, Y. et al. "VB-DDC Design Based on Polyphase Bandpass Filter", p. 1, retrieved from the Internet Sep. 12, 2012 at: http://en.cnki.com.cn/Article_en/CJFDTOTAL-SJCJ200803023.htm.

Extended European Search Report for EP Patent Appln. No. 12290444.4 (May 10, 2013).

* cited by examiner

DIGITAL DOWN CONVERTER CIRCUIT

CROSS-REFERENCE TO RELATED APPLICATIONS

This application claims the priority under 35 U.S.C. §119 of European patent application no. 12290444.4, filed on Dec. 17, 2012, the contents of which are incorporated by reference herein.

This invention relates to digital down converter (DDC) circuits.

A DDC circuit is used to convert an incident signal, for example a wirelessly received RF signal, to baseband for subsequent processing.

FIG. 1 shows the place of the DDC block within a digital receiver chain. The RF module down converts the signal from the antenna 12 to a frequency Fc, after amplification and filtering. This is shown as x(t).

The RF signal is then converted to digital by an analogue to digital converter (ADC) 14. The ADC has a sampling rate Fs. The digital signal x(nT) is processed to baseband by the DDC circuit 16, for subsequent processing as represented by block 18. This post processing block is an application dependent block. It may include for instance, channel demodulation, channel stacking or software defined radio.

The spectrum of the analogue input signal x(t) at the input of the ADC is illustrated in FIG. 2. The signal is real and accordingly has Hermitian symmetry. The centre frequency is shown as Fc and the bandwidth is shown as BW.

The role of the DDC 16 is to down convert the input signal to baseband, to cancel cross-talk spurious signals, to reduce the sampling rate as much as possible by decimation and to correct the frequency drift caused by the analogue component imperfections. These tasks (down conversion, decimation and frequency offset correction) depend upon the sampling rate Fs, the center frequency Fc and the signal bandwidth BW (ranging from F1 to F2 as shown in FIG. 2).

A basic algorithm of a digital down conversion process is illustrated in FIG. 3. The analog band pass signal x(t) located at some frequency Fc is first sampled by an ADC 14 at Fs=1/T rate, the sampled signal x(nT) is then down converted to baseband by a first rotator 30 which yields I and Q (in-phase and quadrature) complex signals. The outputs of this rotator 30 are then filtered by a real low pass filter $h_r(n)$ 32 to limit the spectrum and avoid aliasing.

The filtered quadrature components $x_{IF}(nT)$ and $x_{QF}(nT)$ are then decimated safely by some factor M to reduce the sampling rate, shown by decimator 34. A second rotator 36 serves to correct the frequency offset $\Delta F$ and the rest of the processing follows.

There are two domains of operations as shown, one at Fs and the other at Fs/M.

Various optimizations exist for this architecture. An efficient and very popular method consists of choosing Fc=Fs/4. This makes the operations of down conversion and down sampling very simple. For instance the first rotation $e^{-(j*2*\pi*n*Fc/Fs)}$ will reduce to simple multiplications by $e^{-(j*n*\pi/2)}$ (i.e. repetition of the sequence: 0, j, −1, −j, . . . ). These multiplications could be incorporated to the coefficients of the decimation filter.

Another technique used for limited band pass signals exploits an alias of the under sampled signal to achieve the down conversion. To avoid destructing aliasing, it requires a specific relationship between Fs and F2:

$$Fs=2*F2/m,$$

where m is the highest integer less or equal to F2/BW.

The Hilbert transformer technique is also an interesting method. It consists of generating an analytic signal. After removing the negative spectrum part, the signal can be decimated and rotated to baseband, without worrying about the image replicas.

It is clear that setting Fs=4 Fc will simplify the DDC implementation, however this will make the design of the ADC more complex. Indeed this solution is discarded in broadband receivers because the signal Fs is of the order of several Giga-samples per second. For instance for a satellite receiver, the center frequency Fc can be located at 500 MHz, so setting Fs=2 GHz is too high to respect the limitation of power consumption.

The pass-band under sampling technique is constrained by the position of the channel, Fs depends on F2 so it is application dependent.

The method based on the Hilbert transformer, assumes that there is no signal out of the useful band, this to prevent from the aliasing after decimation. In practice it is not possible to rely on this assumption.

The invention provides an apparatus and method as defined in the claims.

According to the invention, there is provided a digital down converter comprising:

an input for receiving a sampled signal having a frequency band of interest, sampled at a first sampling rate;

a commutator structure for distributing a set of real sampled signals for polyphase filtering;

a complex band pass polyphase filter associated with the distributed signals, for generating in phase and quadrature filtered components;

a baseband notch filter; and a frequency translator for generating in phase and quadrature components of the frequency band of interest at baseband.

By generating real sub-sampled signals, for example by a simple down conversion process, the need for a complex rotator operating at the sampling frequency is avoided.

After the decimation (by the polyphase filter), the baseband notch filter is able to filter a frequency component corresponding to a spurious signal due to cross-talk between the digital sampling clocks and the RF analog components.

The complex band pass filters enable optimization of the implementation of a polyphase decimator. These complex filters can be associated with (i.e. centred around) the centre frequency of the band of interest. The filters can have the same complexity as the low pass filters used in the prior art, with coefficients that can be generated from real low-pass filters.

A shared latch element can be used for the in phase and quadrature components of each branch. In this way, the number of latch elements (such as FIFO registers) is reduced compared to an arrangement with a complex subsampling approach, such as a rotator, which requires separate latch elements for the in phase and quadrature channels. For example, a single latch element can be provided for each pair of in phase and quadrature components of each distributed signal.

The distributed signals are combined after polyphase filtering to generate an in-phase filtered signal and a quadrature filtered signal. A notch filter can be provided for each of the two filtered signals.

The first sampling rate can be 1800 MHz and the bandwidth of the frequency band of interest can be 500 MHz. This corresponds to use as a satellite receiver.

The invention also provides a digital down conversion method, comprising:
receiving a sampled signal having a frequency band of interest, sampled at a first sampling rate;
distributing a set of real sampled signals for polyphase filtering;
generating in phase and quadrature filtered components of the distributed signals using a polyphase band pass complex filter;
cancelling the spur using a baseband notch filter; and
performing a frequency translation to generate in phase and quadrature components of the frequency band of interest at baseband.

The distribution step comprises a sub-sampling operation which can involve commutating the input to multiple outputs. The low pass notch filter filters the unwanted spur.

An example of the invention will now be described in detail with reference to the accompanying drawings, in which.

The invention provides a digital down converter in which a sampled input signal is distributed to generate a set of real sampled signals. These are complex filtered in I- and Q-channels, before a baseband notch filter is applied to cancel the unwanted spur. This reduces the high frequency processing and simplifies the filtering of sampling noise associated with the A/D conversion.

An implementation of a DDC based on the basic approaches discussed above and which has been used by the applicant will first be described with reference to FIG. 4, before discussing the approach of the invention.

The ADC 14 and rotator 30 are as described with reference to FIG. 3. The filter arrangement comprises a polyphase structure. Filters hr_0, hr_1 . . . hr M−1 represent the polyphase branches of the decimation filter.

Figure 3:
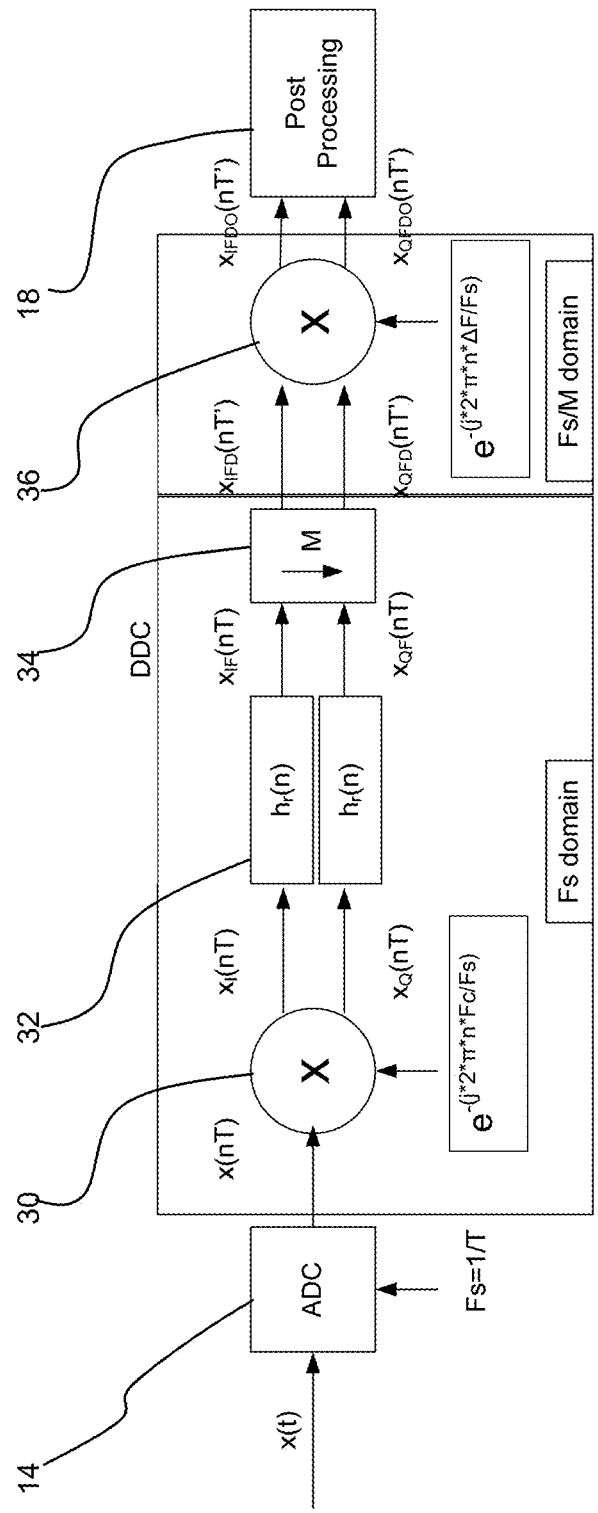
FIG. 3 shows a digital down conversion process.

Compared to the basic method of FIG. 3, much more of the processing is carried out at the lower sampling rate Fs/M, and this reduces consequently the computation effort.

The rotator 30 operates at the high sampling frequency Fs. The rotator generates complex valued outputs, so that a set of first in first out (FIFO) registers is needed for each of the in phase and quadrature parts of the signal. The polyphase decimation filter is real, and the branches shown in the different figures are the polyphase arrangement of the real decimation filter.

The digital signal will include a frequency component derived from the sampling switching signal at frequency Fs. This represents cross talk between the digital and analogue domains. The rotator converts this frequency to Fs/M, and this provides a frequency spur which needs to be filtered.

Rotators 40 are used to translate the frequency spurs (in the I and Q channels) to baseband, so that they can be removed by baseband notch filters 42. By way of example, if the sampling frequency is 1800 MHz and the decimation factor M is 3, the spur to be filtered is at 600 MHz. After shifting of the signal of interest to baseband (a shift down of 500 MHz, as Fc=500 MHz in this example), the spur remains at 100 MHz. A frequency offset drift is represented by the value ΔF, and the spur frequency ΔFspur is at 100 MHz.

The rotators 40 implement a further 100 MHz frequency shift so that the notch filters can filter out the original interfering 1800 MHz signal from a DC level. The final rotator 44 steps the signal spectrum back to the correct baseband level.

Figure 4:
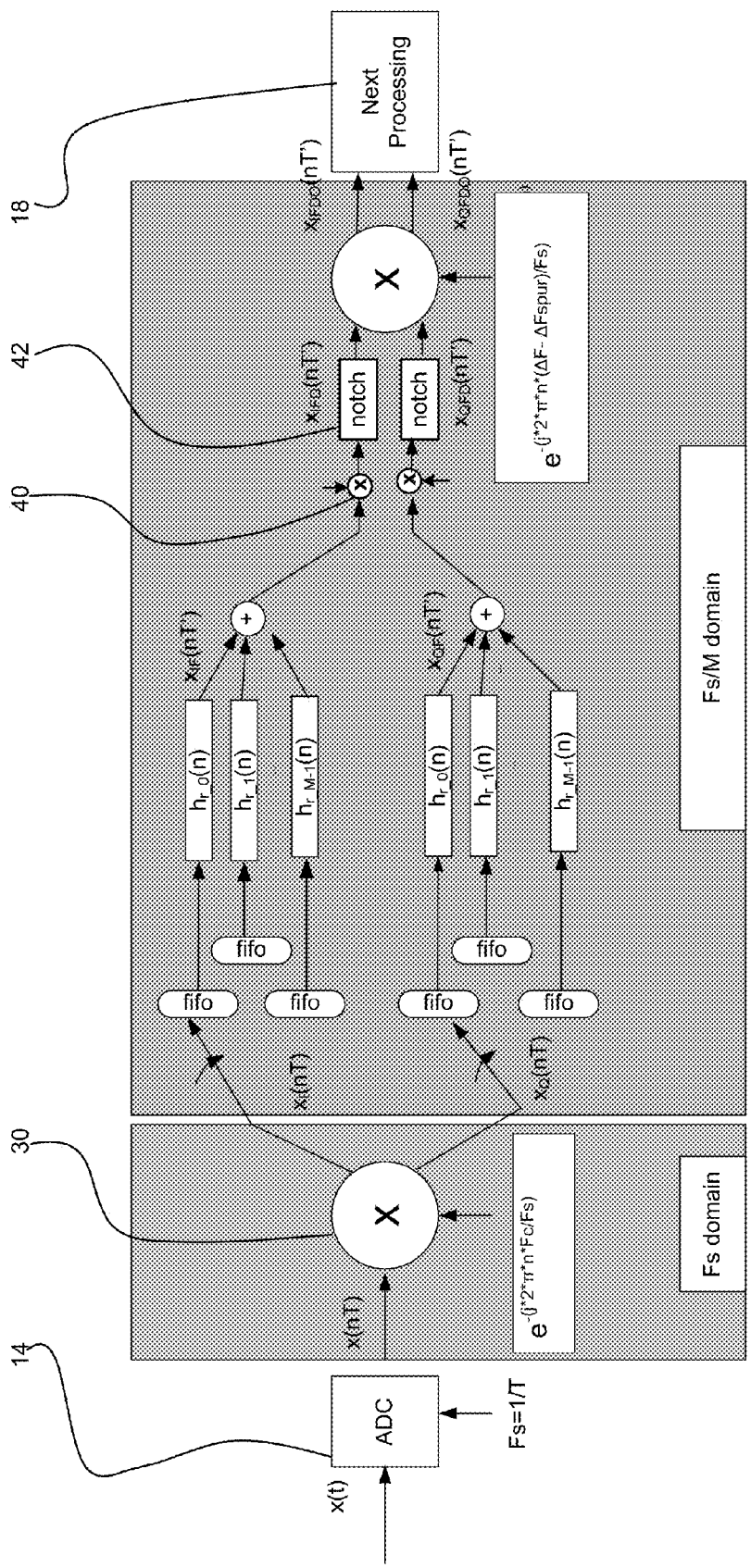
FIG. 4 shows one possible DDC implementation based on the known concepts.
Figure 5:
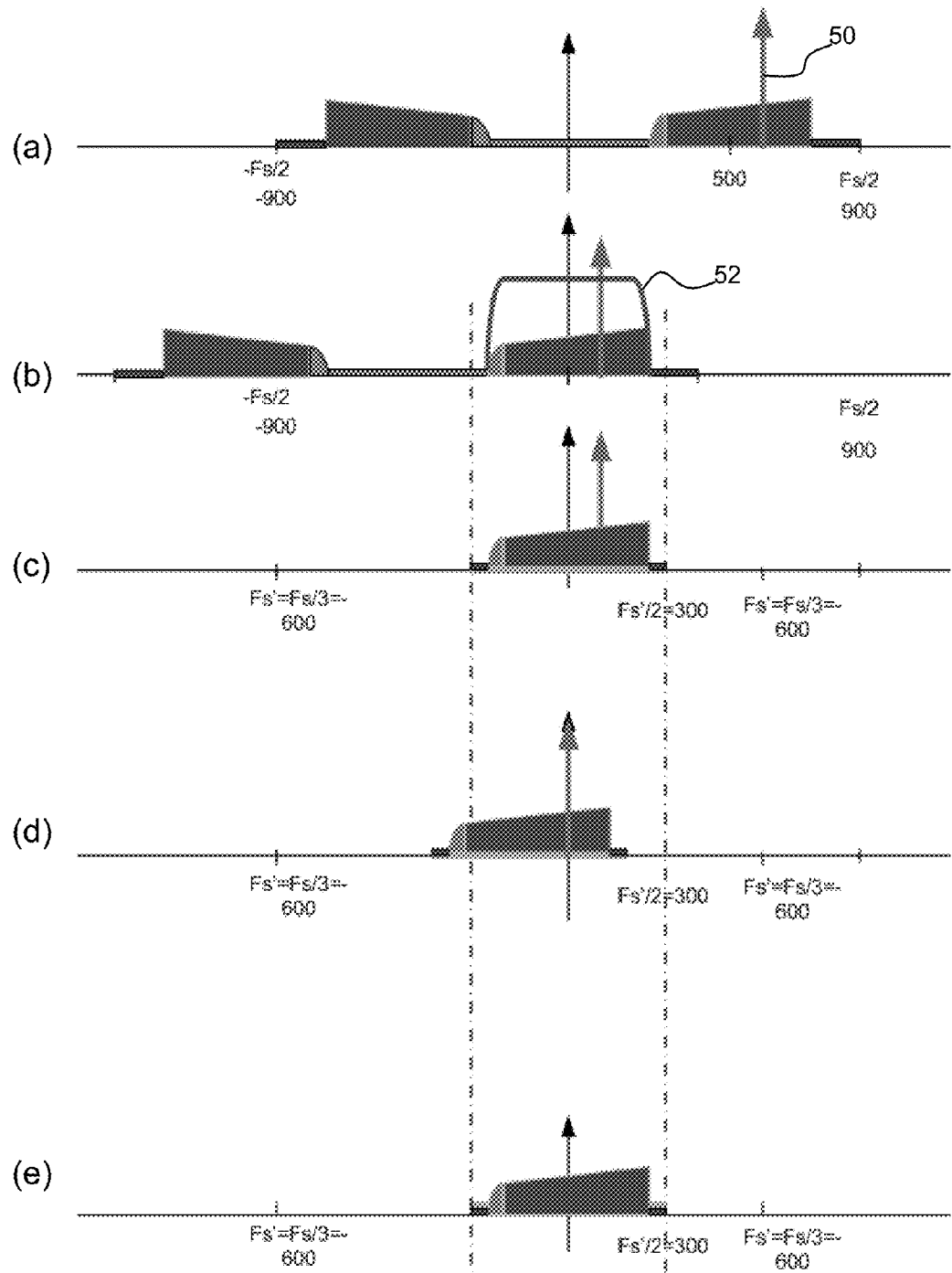
FIG. 5 shows the signal spectra at different points in the circuit of FIG. 4.

FIG. 5 shows the signal spectra at different points in the circuit of FIG. 4.

FIG. 5(a) shows the real (and therefore symmetric about the y-axis) input signal sampled at Fs=1800 MHz, with bandwidth 500 MHz centred at Fc=500 MHz. The arrow 50 represents the frequency spur derived from the sampling operation after decimation, and therefore at 600 MHz. This signal is transmitted back through the ADC by cross talk and thus also appears at the input.

The rotator 30 operating at 1800 MHz shifts the signal down to baseband as shown in FIG. 5(b). This 500 MHz shift places the spur at 100 MHz.

A real low pass filter is used, with a frequency characteristic represented by the line 52. The result of the filtering and decimation by a factor 3 is shown in FIG. 5(c).

The frequency shift performed by the rotators 40 is shown in FIG. 5(d), which enables the spur to be filtered out using a baseband notch filter 42. The final rotation by rotator 44 shifts the wanted signal back to baseband as shown in FIG. 5(e).

The arrangement of FIG. 4 is limited by the first rotator 30 which is still operating at the high sampling rate Fs. The early baseband conversion by the rotator also makes the implementation of the decimation block less efficient, since two input FIFOs are required to manage the complex input signal.

This invention is based on this implementation. It combines a digital re-sampling technique with complex band pass filtering to down convert and decimate the incoming input signal. As will be apparent from the description below, the approach of the invention avoids the need for the input rotator. In addition, only one FIFO is needed for each decimated frequency. It also simplifies the implementation of the notch filter to remove the sampling frequency spur.

Figure 6:
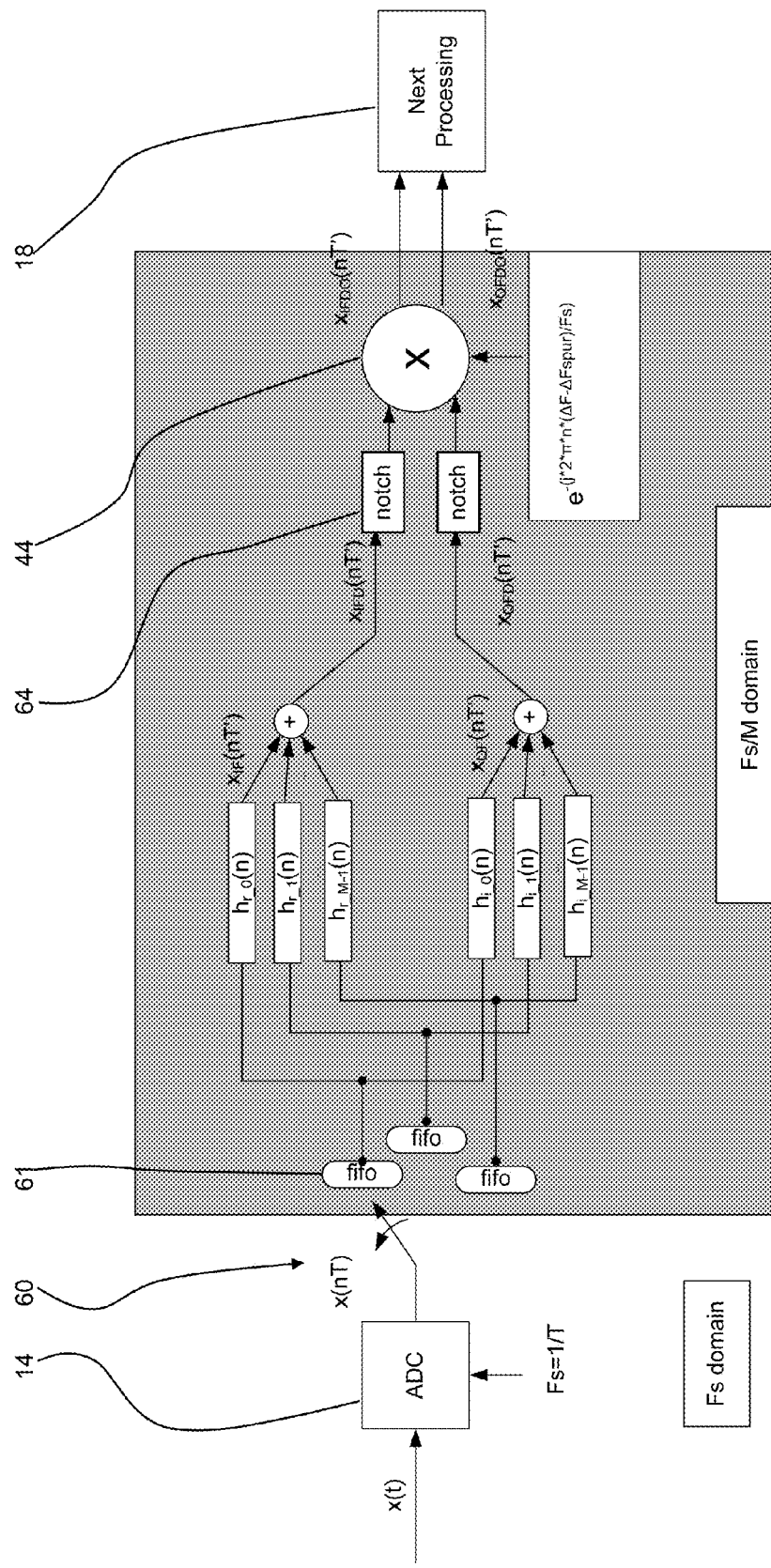
FIG. 6 shows an example of an the arrangement of the invention.

FIG. 6 shows the arrangement of the invention.

The digital sampled signal x(nT) (the same as in FIG. 4) is decimated (i.e. downsampled) and filtered as part of the downsampling operation by a decimation factor M. This is represented by unit 60, which can be considered to be a commutator structure for distributing a set of real sampled signals for polyphase filtering. For ease of comparison with FIG. 4, M=3. This operation yields three real signals.

A single latch element, shown as a FIFO register 61, is needed for each channel, shared between the I and Q channels.

With this approach, the digital computations are now all performed in the Fs/M domain. The input of the decimation filter is a real signal so only one input FIFO can be used to manage the filter delay line. The real part of the filter (hr_k(n), k=0 . . . M−1) filters the real input signal to provide the in-phase component xIF(nT') while the imaginary part of the filter (hi_k(n), k=0 . . . M−1) filters the same input signal to provide the quadrature component xQF(nT').

This filter aims to removes all the frequency components outside the interval [Fc−BW/2 . . . Fc+BW/2].

Figure 1:
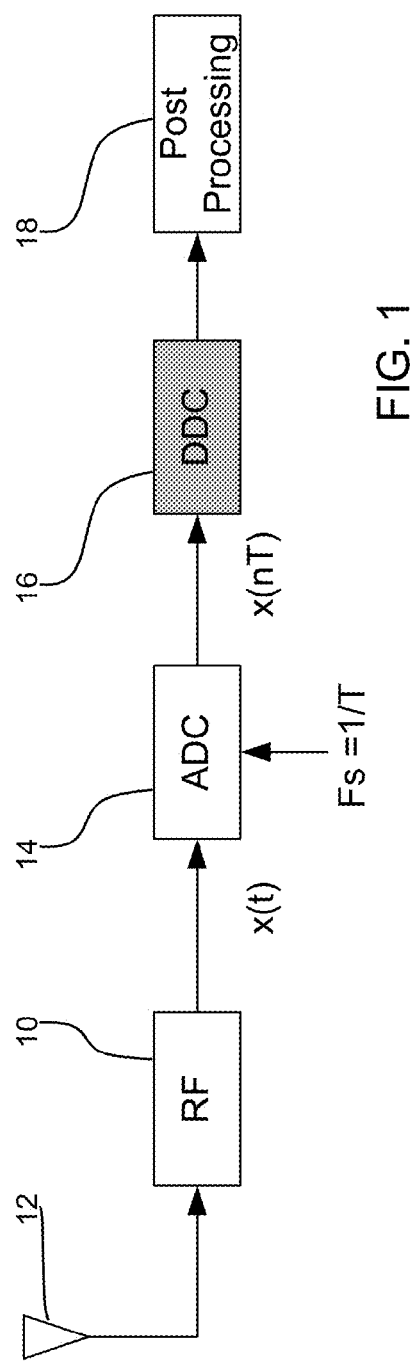
FIG. 1 shows the basic architecture of a digital receiver chain including a DDC block.
Figure 2:
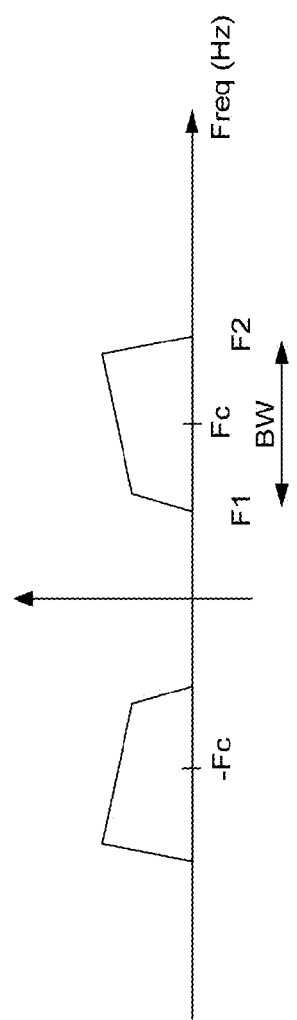
FIG. 2 shows the spectrum of the analogue input signal.

A Hilbert filter is not used in place of the complex band pass filter because there is insufficient information about the signal spectrum. If the signal is not zero outside its bandwidth, destructive aliasing will occur during the decimation phase. The use of complex band pass filters enables input signals to be processed even outside the band of interest. The band pass filters have a pass band corresponding to the signal of interest, i.e. centred at the frequency Fc and with a bandwidth to cover the signal bandwidth BW as shown in FIG. 2.

The filtered signal components are combined and provided to notch filter 64 (one in the I path and one in the Q path). These are for filtering the frequency spur, but no spectrum translation is needed. In particular, the decimation before shifting the signal band of interest can be used to place the frequency spur at baseband.

The final rotator 44 centres the frequency band of interest at DC.

The translation to the baseband is in this way realised in two steps. A first step makes use of a desired aliasing mechanism and a second step makes use of the second rotator 44 already available in the chain to correct the frequency offset drift. To this ΔF frequency drift, an additional offset ΔFspur is added to the second rotator 44 to center the desired bandwidth around zero.

Figure 7:
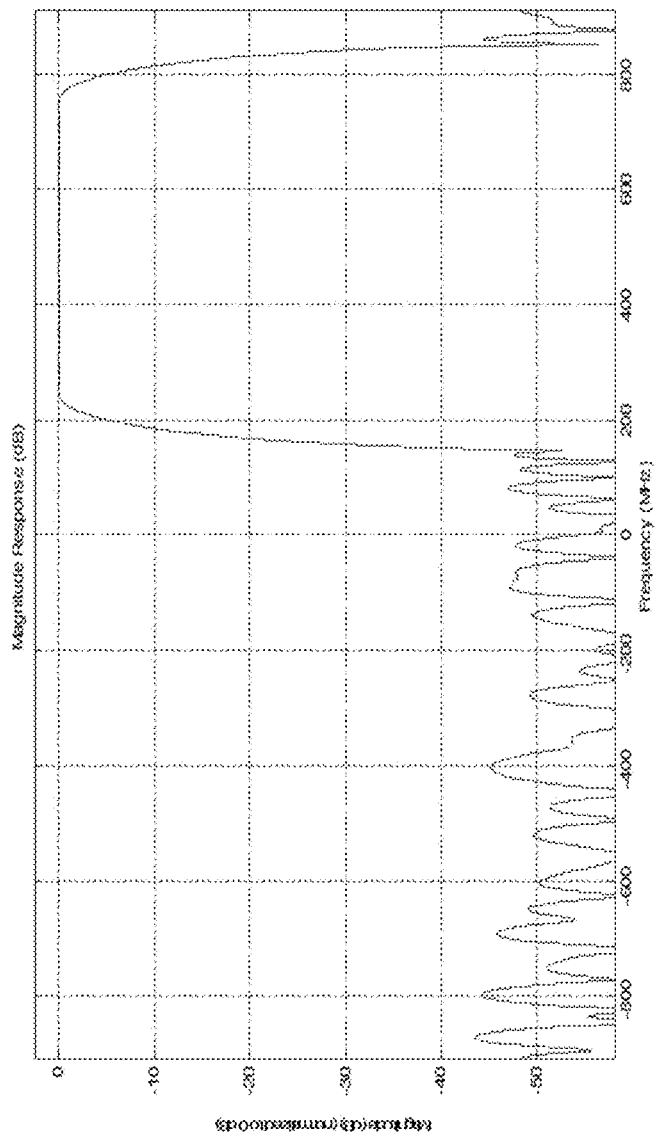
FIG. 7 shows a spectrum of the complex band pass filter used for each decimated channel in the arrangement of FIG. 6.

FIG. 7 shows a spectrum of the complex band pass filter used for each decimated channel.

The filter components in the I and Q branches are components of a single filter function.

The filter for the I branch is the real part of the bandpass complex filter (i.e. hr(n)) and the filter for the Q branch is the imaginary part of the same bandpass complex filter (i.e. hi(n)). In both branches, the same real signal is filtered by the respective part of the complex filter.

The band pass filter is centred on 500 MHz with a band pass of approximately 250 MHz to 750 MHz.

Figure 8:
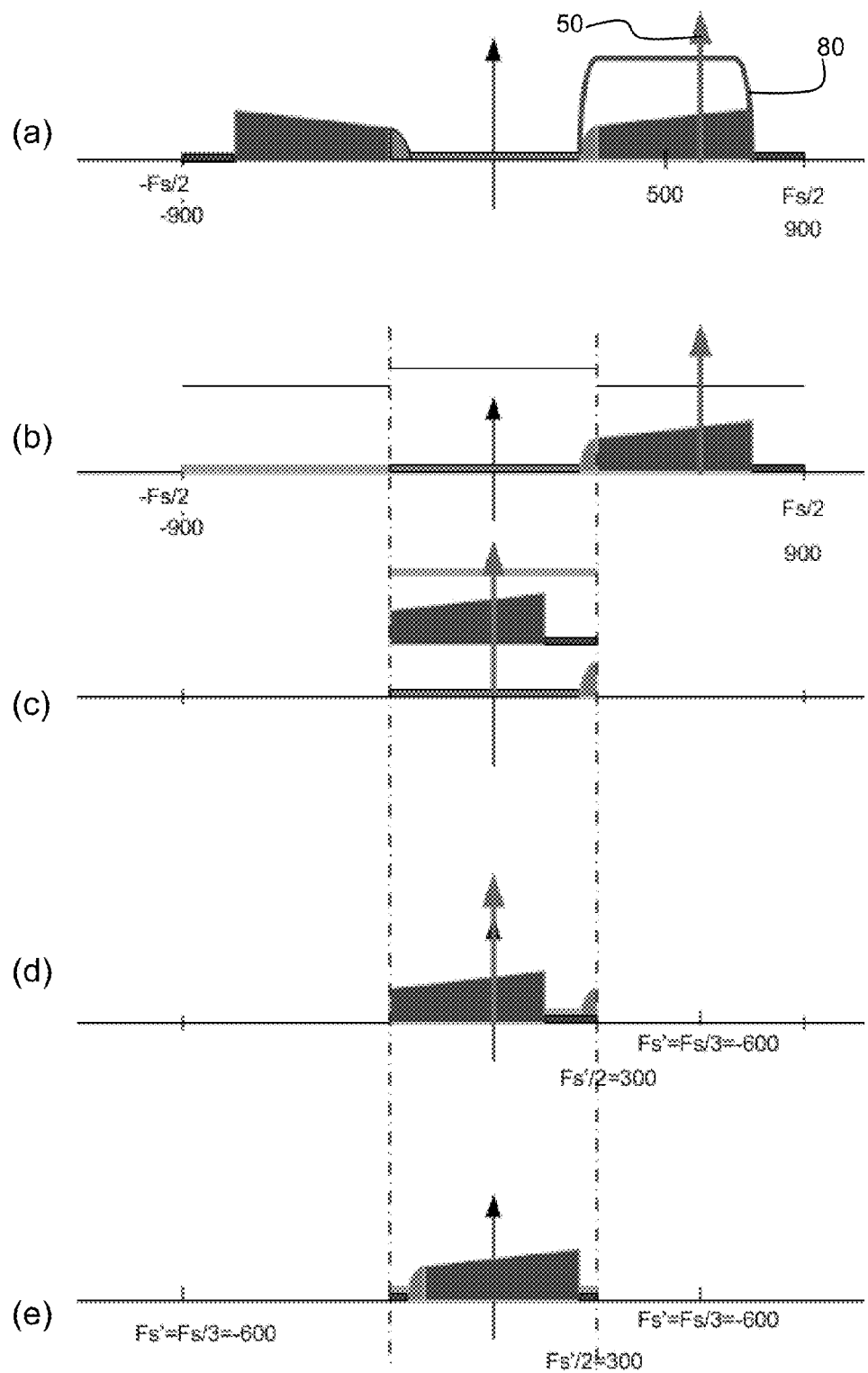
FIG. 8 shows the signal spectra at different points in the circuit of FIG. 6.

FIG. 8 shows the signal spectra at different points in the circuit of FIG. 6.

FIG. 8(a) shows the real (and therefore symmetric about the y-axis) input signal sampled at Fs=1800 MHz, with bandwidth 500 MHz centred at Fc=500 MHz. The arrow 50 again represents the frequency spur derived from the sampling operation after decimation, and therefore at 600 MHz.

The band pass complex filter characteristic is shown as 80. The complex band pass filter characteristic is non-symmetrical as shown, and only on the positive frequency side. FIG. 8(b) shows the spectrum after the complex band pass filtering.

The frequency components shown outside the band of interest are simply shown to represent non-perfect filtering.

FIG. 8(c) shows the effect of the decimation by a factor of 3. The frequency spur lies in the middle of the 300 MHz to 900 MHz band, and therefore is aliased to DC by the decimation function, which corresponds to a sampling at 600 MHz.

FIG. 8(c) shows separately the components resulting from the −900 MHz to −300 MHz, −300 MHz to 300 MHz and 300 MHz to 900 MHz bands.

FIG. 8(d) shows the combined spectrum.

There is no unwanted signal aliasing in the band of interest of −300 MHz to +300 MHz and the spur is positioned at DC to enable simple filtering with a DC notch filter 64.

Note that for simplicity signal folding resulting from the aliasing is not represented in the figures.

FIG. 8(e) shows a right shift by 100 MHz to retrieve the original spectrum using the rotator 44.

In the arrangement of the invention, the sampling rate Fs can be less than 4 Fc, which facilitates the design of the ADC and lowers the power consumption.

There is no constraint on the highest frequency F2 of the signal. The approach is thus is independent from the position of the useful band in Nyquist zones.

The signal spectrum is not constrained to be zero out of band. This reduces the complexity of the RF/IF filters;

The first rotator operating at high frequency is removed. This saves area and power but also gives a performance improvement by avoiding the quantization noise added by the first rotator.

The approach described above performs an efficient baseband conversion because it is computed by the second rotator which can have a better resolution.

The approach described above provides a simplified polyphase filter implementation, because only one input FIFO is needed to manage the delay line of each filter instead of two.

Figure 9:
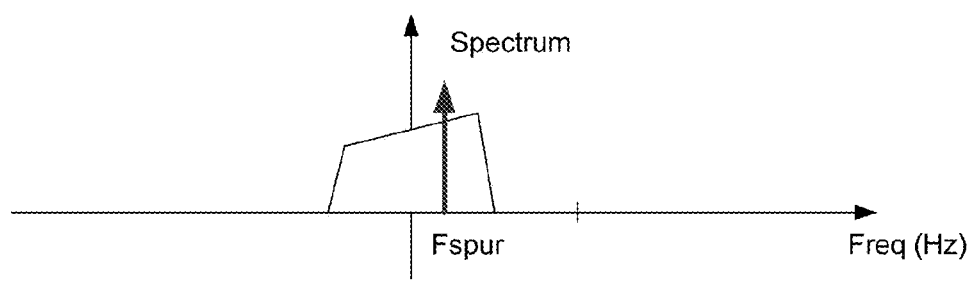
FIG. 9 shows how in the arrangement of FIG. 4 the sampling frequency spur is processed.
Figure 10:
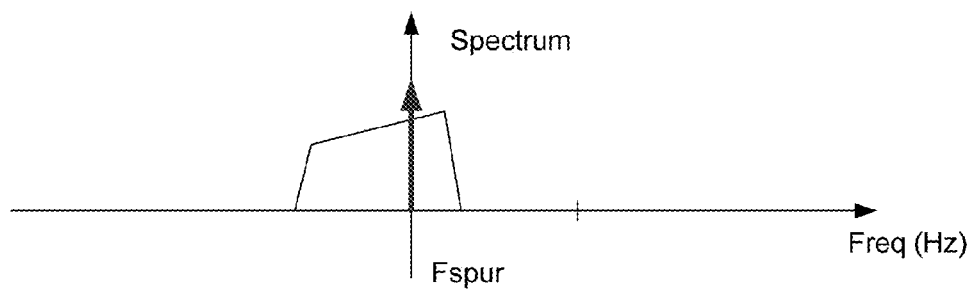
FIG. 10 shows how in the arrangement of FIG. 6 the sampling frequency spur is processed.

The spur management is also simplified. In the arrangement of FIG. 4, the first rotator 30 translates this spur to a positive non-zero frequency Fspur (as shown in FIG. 9). Thus, the notch filter used to cancel this spur must first translate the spectrum from Fspur to zero. The arrangement of FIG. 6 avoids this operation. The decimation sets the spur at zero frequency in straightforward way as shown in FIG. 10.

The invention uses an efficient polyphase approach. Only the input commutator operates at the high sampling frequency Fs, whereas the polyphase branches operate only at Fs/M.

The invention is of particular interest for a satellite transponder, or for digital broadband tuners.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. A digital down converter comprising:
   an input for receiving a sampled signal having a frequency band of interest, sampled at a first sampling rate;
   a commutator structure for distributing a set of real sampled signals for polyphase filtering;
   a complex band pass polyphase filter associated with the distributed signals, for generating in phase and quadrature filtered components;
   a baseband notch filter; and
   a frequency translator for generating in phase and quadrature components of the frequency band of interest at baseband.

2. A converter as claimed in claim 1, wherein the commutator structure provides M real sampled signals.

3. A converter as claimed in claim 1, wherein the complex polyphase filter comprises branches of a band pass filter associated with the frequency band of interest of the input.

4. A converter as claimed in claim 1, comprising a shared latch element for the in phase and quadrature components of each distributed signal.

5. A converter as claimed in claim 4, wherein a single latch element is provided for each pair of in phase and quadrature components of each distributed signal.

6. A converter as claimed in claim 1, wherein the first sampling rate is 1800 MHz and the bandwidth of the frequency band of interest is 500 MHz.

7. A satellite receiver comprising:
   an antenna;
   an analogue to digital converter for generating a sampled signal; and
   a digital down converter, the digital down converter comprising:
      an input for receiving a sampled signal having a frequency band of interest, sampled at a first sampling rate;
      a commutator structure for distributing a set of real sampled signals for polyphase filtering;
      a complex band pass polyphase filter associated with the distributed signals, for generating in phase and quadrature filtered components;
      a baseband notch filter; and
      a frequency translator for generating in phase and quadrature components of the frequency band of interest at baseband.

8. A digital down conversion method, comprising:
   receiving a sampled signal having a frequency band of interest, sampled at a first sampling rate;
   distributing a set of real sampled signals for polyphase filtering;
   generating in phase and quadrature filtered components of the distributed signals using a polyphase band pass complex filter;
   filtering using a baseband notch filter; and
   performing a frequency translation to generate in phase and quadrature components of the frequency band of interest at baseband.

9. A method as claimed in claim 8, wherein distributing a set of real sampled signals comprises providing M real sampled signals.

10. A method as claimed in claim 8, comprising latching each distributed signal to the real and imaginary complex filter components using a shared latch element.

11. A method as claimed in claim 8, wherein the first sampling rate is 1800 MHz and the bandwidth of the frequency band of interest is 500 MHz.

12. A non-transitory storage medium comprising a computer program code for one or more programs adapted to perform all the steps of claim 8, when said computer program is run on a computer.

* * * * *